US006178532B1

(12) United States Patent
Pierce et al.

(10) Patent No.: US 6,178,532 B1
(45) Date of Patent: Jan. 23, 2001

(54) ON-CHIP CIRCUIT AND METHOD FOR TESTING MEMORY DEVICES

(75) Inventors: Kim M. Pierce; Charles L. Ingalls, both of Meridian, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/096,279

(22) Filed: Jun. 11, 1998

(51) Int. Cl.[7] ................................................. G11C 29/00
(52) U.S. Cl. ........................... 714/718; 365/200; 365/201
(58) Field of Search ............................ 714/718; 365/201, 365/200, 233

(56) References Cited

U.S. PATENT DOCUMENTS

| 4,183,095 | * | 1/1980 | Ward | 365/189.02 |
|---|---|---|---|---|
| 4,669,082 | * | 5/1987 | Tilghman et al. | 714/718 |
| 5,016,220 |  | 5/1991 | Yamagata | 365/201 |
| 5,231,605 |  | 7/1993 | Lee | 365/201 |
| 5,367,522 | * | 11/1994 | Otani | 370/468 |
| 5,533,194 | * | 7/1996 | Albin et al. | 714/42 |
| 5,568,437 |  | 10/1996 | Jamal | 365/201 |
| 5,757,705 |  | 5/1998 | Manning | 365/201 |
| 5,812,562 | * | 9/1998 | Baeg | 714/726 |
| 5,818,754 | * | 10/1998 | Ogura | 365/185.09 |
| 6,002,620 | * | 12/1999 | Tran et al. | 365/200 |
| 6,003,142 | * | 12/1999 | Mori | 714/30 |
| 6,006,349 | * | 12/1999 | Fujisaki | 714/738 |
| 6,014,759 | * | 1/2000 | Manning | 714/42 |
| 6,014,763 | * | 1/2000 | Dhong et al. | 714/724 |
| 6,016,565 | * | 1/2000 | Miura | 714/736 |
| 6,058,056 | * | 5/2000 | Beffa et al. | 365/201 |
| 6,067,649 | * | 5/2000 | Goodwin | 714/718 |

FOREIGN PATENT DOCUMENTS 0 744 755 A1    11/1996 (EP) .

OTHER PUBLICATIONS

Sinaki (C–17A Mission Computer Internal Built–in Test and I–level Fault Logging, IEEE, 1993).*

Iwata et al(A High–Density Nand EEPROM with Block–Page Programming for Microcomputer Applications. IEEE, 1990).*

* cited by examiner

Primary Examiner—Albert De Cady
Assistant Examiner—Guy J. Lamarre
(74) Attorney, Agent, or Firm—Dorsey & Whitney LLP

(57) ABSTRACT

An on-chip test circuit in an integrated circuit memory device includes a test mode terminal and a test data storage circuit having an input coupled to a data terminal of the memory device and an output coupled to a memory-cell array in the memory device. The storage circuit further includes terminals adapted to receive respective read test data and write test data signals. The storage circuit stores bits of data applied on the data terminal when the write test data signal is active. The storage circuit provides on its output the bits of stored data when the read test data signal is active. An error detection circuit includes a first input coupled to the memory-cell array and a second input coupled to the output of the storage circuit. The error detection circuit develops an active error signal on an output when the data on its input is unequal. A test control circuit is coupled to the terminals of the test data storage circuit, and to the test mode terminal. When the test mode signal is active, the test control circuit operates in a first mode to transfer data on the data terminal into the storage circuit, and operates in a second mode to transfer data from the storage circuit to the memory cells in the array. The test control circuit then operates in a third mode to access data stored in the memory cells and in the storage circuit such that the error detection circuit compares the data stored in each addressed memory cell to the data initially transferred to that memory cell.

29 Claims, 3 Drawing Sheets

ON-CHIP CIRCUIT AND METHOD FOR TESTING MEMORY DEVICES

TECHNICAL FIELD

The present invention relates generally to the testing of semiconductor memories, and more specifically to a method and apparatus that reduces the time for testing memory cells and enables a variety of test data patterns to be used in performing such tests.

BACKGROUND OF THE INVENTION

During the manufacture of a semiconductor memory, such as a synchronous dynamic random access memories ("SDRAMs"), it is necessary to test the memory to ensure it is operating properly. Electronic and computer systems containing semiconductor memories also normally test the memories when power is initially applied to the system. A typical SDRAM includes at least one array of memory cells arranged in rows and columns, and each memory cell must be tested to ensure it is operating properly. In a typical prior art test method, data having a first binary value (e.g., a "1") is written to and read from all memory cells in the arrays, and thereafter data having a second binary value (e.g., a "0") is typically written to and read from the memory cells. A memory cell is determined to be defective when the data written to the memory cell does not equal that read from the memory cell. As understood by one skilled in the art, other test data patterns may be utilized in testing the memory cells, such as an alternating bit pattern 101010 . . . written to the memory cells in each row of the arrays.

In a typical test configuration, an automated tester is coupled to address, data, and control buses of the SDRAM, and develops signals on these buses to perform the desired tests. The tester applies data transfer commands on the control bus, addresses on the address bus, and either provides or receives data on the data bus depending on whether the data transfer command is a read or write. In addition, the tester develops a clock signal which drives circuitry in the SDRAM to synchronously perform each of the steps involved in a particular data transfer operation as understood by one skilled in the art. The signals developed by the tester must satisfy particular timing parameters of the SDRAM that are typically established relative to particular edges of the clock signal.

In modern SDRAMs, the tester may need to develop a clock signal having a frequency of 100 megahertz or greater, and must also develop the associated address, data, and control signals at increasingly faster rates due to the shorter interval between particular edges of the clock signal. It is known in electronics that as the frequency of operation increases, the circuitry associated with a particular application typically becomes more complex and, as a result, typically more expensive. This is due in part to the potential for coupling electromagnetic energy at high frequencies between circuit lines, the critical nature of physical line lengths at high frequencies, and the potential for small delays to result in inoperability of the circuit. The tester could supply a lower frequency clock signal to the SDRAM, but this would increase the time and thus the cost of testing the SDRAM. Thus, the tester must supply very high frequency clock signals to modern SDRAMs. Testers capable of operating at these higher frequencies typically are more expensive than lower speed testers. In fact, the cost of such testers typically increases exponentially with increases in the frequency of operation. For example, a test operating at 50 megahertz may cost approximately $1 million while a tester operating at 100 megahertz can cost up to $5 million.

In an attempt to minimize the cost of the required tester, many SDRAMs include on-chip test circuitry. In such an SDRAM, the tester develops signals which place the SDRAM in a test mode, and the on-chip test circuitry then writes data to and reads data from the memory cells to verify their proper operation. The results of the tests performed by the on-chip test circuitry are typically provided on a pin or pins of the SDRAM, and the tester then monitors these pins to determine whether the SDRAM is defective. Such on-chip test circuitry is typically able to transfer data to and from the memory cells very quickly reducing the time required for testing the SDRAM. However, the tester must still apply the high frequency clock signal to the SDRAM in order to drive the on-chip test circuitry during testing. In addition, the on-chip test circuitry typically utilizes only a limited number of predetermined test data patterns in testing the memory cells in order to minimize the size and complexity of the on-chip test circuitry. Although the foregoing discussion was directed toward SDRAMs, one skilled in the art will realize such problems exist when testing any high-speed memory device, including SLDRAM, SRAM, and RAMBUS devices, as understood by one skilled in the art.

There is a need for an on-chip test circuit enabling a low frequency tester to test the memory cells in a high-speed memory device with a variety of test data patterns at the desired frequency of operation of the memory device.

SUMMARY OF THE INVENTION

An on-chip test circuit is included in an integrated circuit memory device including a memory-cell array having a plurality of memory cells arranged in rows and columns, the memory device further including a data terminal adapted to receive a data signal. The test circuit includes a test mode terminal adapted to receive a test mode signal. A test data storage circuit includes an input coupled to the data terminal and an output coupled to the memory-cell array. The test data storage circuit further includes terminals adapted to receive respective read test data and write test data signals. The test data storage circuit stores bits of data applied on the data terminal when the write test data signal is active. The test data storage circuit provides on its output the bits of stored data when the read test data signal is active. An error detection circuit includes a first input coupled to the memory-cell array and a second input coupled to the output of the test data storage circuit. The error detection circuit develops an active error signal on an output when the data on its inputs is unequal.

A test control circuit is coupled to the terminals of the test data storage circuit, and to the test mode terminal. When the test mode signal is active, the test control circuit operates in a first mode to activate the write test data signal and transfer data applied on the data terminal into the storage circuit. The test control circuit operates in a second mode to activate the read test data signal and transfer data in the storage circuit to memory cells in the array. The test control circuit operates in a third mode to activate the read test data signal and to access data stored in the memory cells such that the error detection circuit compares the data stored in the memory cell to the data that was initially transferred to the memory cell.

DETAILED DESCRIPTION OF THE INVENTION

Figure 1:
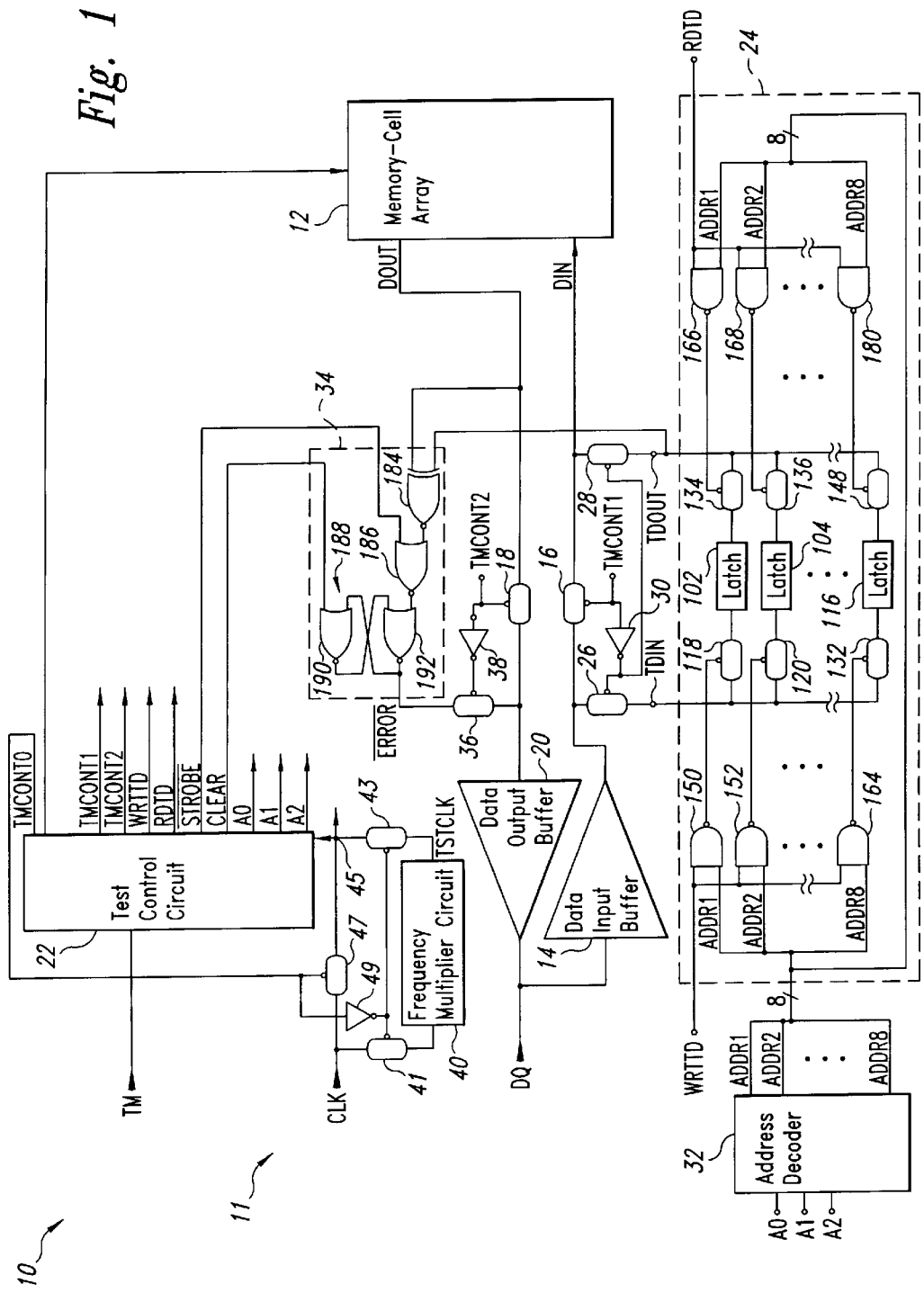
FIG. 1 is a functional block diagram of a test circuit according to one embodiment of the present invention.

FIG. 1 is a functional block diagram of portions of a memory device 10 that includes an on-chip test circuit 11 according to one embodiment of the present invention. An external circuit (not shown in FIG. 1) applies test data on a data terminal DQ, and applies a clock signal CLK and a test mode signal TM to the memory device 10. In response to these signals, the memory device 10 stores test data applied on the terminal DQ and utilizes this stored test data in testing the operation of memory cells in a conventional memory-cell array 12, as will be explained in more detail below. The array 12 includes a number of memory cells arranged in rows and columns (not shown in FIG. 1). The memory cells in a respective row are coupled to an associated word line and the memory cells in a respective column are coupled to one of an associated pair of complementary digit lines as known in the art. In FIG. 1, the array 12 is shown schematically as including a data input terminal DIN and data output terminal DOUT on which data is respectively transferred to and from the memory cells in the array 12. The schematic representation of the array 12 is used merely for ease of explanation, and one skilled in the art will realize the terminal DIN corresponds to a portion of conventional data write path that would typically include data write drivers coupled to associated input/output lines which are in turn selectively coupled through input/output transistors to the digit lines in the array 12. Similarly, the data output terminal DOUT corresponds to a portion of a conventional data read path that would typically include sense amplifiers coupled between the digit lines which are selectively coupled through the input/output transistors to input/output lines which are, in turn, coupled to data amplifiers.

In the memory device 10, a data input buffer 14 receives data applied on the data terminal DQ and outputs the data through a transfer gate 16 to the data input terminal DIN of the array 12. The data output from the array 12 on the terminal DOUT is transferred through a transfer gate 18 to a data output buffer 20 which, in turn, provides the data on the data terminal DQ. The transfer gates 16 and 18 receive first and second test mode control signals TMCONT1 and TMCONT2, respectively, from a test control circuit 22 that controls the operation of the test circuit 11 during the test mode of operation as will be described in more detail below. When the signal TMCONT1 is inactive low, the transfer gate 16 turns ON coupling the terminal DIN to the output of the data input buffer 14, and when the signal TMCONT2 is inactive low the transfer gate 18 turns ON coupling the terminal DOUT to the input of the data output buffer 20. The transfer gates 16 and 18, and all transfer gates discussed below, are conventional and typically include NMOS and PMOS transistors having their sources and drains connected in parallel and receiving complementary control signal on their gates.

The test circuit 11 includes a test data storage circuit 24 having an input terminal TDIN coupled through a transfer gate 26 to the output of the data input buffer 14. The test data storage circuit 24 also has an output terminal TDOUT coupled through a transfer gate 28 to the terminal DIN of the array 12. The transfer gates 26 and 28 receive the signal TMCONT1 through an inverter 30 such that when the test control circuit 22 drives the signal TMCONT1 active high, the transfer gates 26 and 28 turn ON. The storage circuit 24 receives a write test data signal WRTTD and a read test data signal RDTD developed by the test control circuit 22, and further receives a number of decoded address signals ADDR1–ADDR8 developed by an address decoder circuit 32. The address decoder circuit 32 decodes three address signals A0–A2 received from the test control circuit 22 and activates one of the decoded address signals ADDR1–ADDR8 in response to the decoded address signals.

The storage circuit 24 further includes eight latches 102–116, three of which are shown. The latches circuits 102–116 have their inputs coupled through a number of transfer gates 118–132, respectively, to the input terminal TDIN of the storage circuit 24. The outputs of the latches 102–116 are coupled through a number of transfer gates 134–148, respectively, to the output terminal TDOUT of the storage circuit 24. Each of the latches 102–116 is conventional and operates to store data applied on its input and provide the stored data on its output as understood by one skilled in the art. A first group of NAND gates 150–164 have their outputs coupled to the control terminals of the transfer gates 118–132, respectively, and each receives the data signal WRTTD on one input. The first group of NAND gates 150–164 receive on a second input the decoded address signals ADDR1–ADDR8, respectively. The storage circuit 24 further includes a second group of NAND gates 166–180 having their outputs coupled to the control terminals of the transfer gates 134–148, respectively, and receiving on one of their inputs the signal RDTD. The second group of NAND gates 166–180 receive on second inputs the decoded address signals ADDR1–ADDR8, respectively.

In operation, the storage circuit 24 operates in two modes, a write test data mode and a read test data mode characterized by the signals WRTTD and RDTD being active, respectively. In the write test data mode, the storage circuit 24 stores data applied on the input terminal TDIN in the one of the latches 102–116 associated with the activated one of the decoded address signals ADDR1–ADDR8. More specifically, during the write test data mode of operation, the test control circuit 22 activates the write test data signal WRTTD enabling the first group of NAND gates 150–164. After the first group of NAND gates 150–164 are enabled, one of the NAND gates having the active decoded address signal ADDR1–ADDR8 applied to its input drives its output low and thereby activates the associated one of the transfer gates 118–132 coupling the input terminal TDIN to the input of the associated one of the latch circuits 102–116. For example, assume the decoded address signal ADDR2 is active. In response to the active signal ADDR2, the NAND gate 152 drives its output low turning ON the transfer gate 120 and thereby coupling the input terminal TDIN to the input of the latch circuit 104. In this situation, the latch circuit 104 stores the data applied on the input terminal TDIN.

In the read test data mode, the storage circuit 24 sequentially transfers the data stored in the latches 102–116 onto the output terminal TDOUT. More specifically, during the read test data mode the signal RDTD is active enabling the second group of NAND gates 166–180. When the NAND gates 166–180 are enabled, the one of these NAND gates having the active decoded address signal ADDR1–ADDR8 applied on its input drives its output low activating the associated one of the transfer gates 134–148. For example, when the decoded address signal ADDR2 is active, the NAND gate 168 drives its output low turning ON the transfer gate 136 and placing the data stored in the latch 104 on the output terminal TDOUT.

The test circuit 11 further includes an error detection circuit 34 that compares the data from the storage circuit 24 on the output TDOUT to the data output from the array 12 on the terminal DOUT and drives an error signal $\overline{\text{ERROR}}$ active when such compared data is unequal. The error detection circuit 34 includes an XOR gate 184 having first and second inputs receiving the data on the terminals DOUT TDOUT, respectively. The output of the XOR gate 184 is coupled to the input of a NOR gate 186 which receives a strobe signal $\overline{\text{STROBE}}$ from the test control circuit 22 on a second input. An RS flip-flop 188 including two cross-coupled NOR gates 190 and 192 receives a clear signal CLEAR from the test control circuit 22 on a reset input, and receives a set input from the output of the NOR gate 186. The RS flip-flop 188 provides the error signal $\overline{\text{ERROR}}$ on the output of the NOR gate 192.

Figure 2:
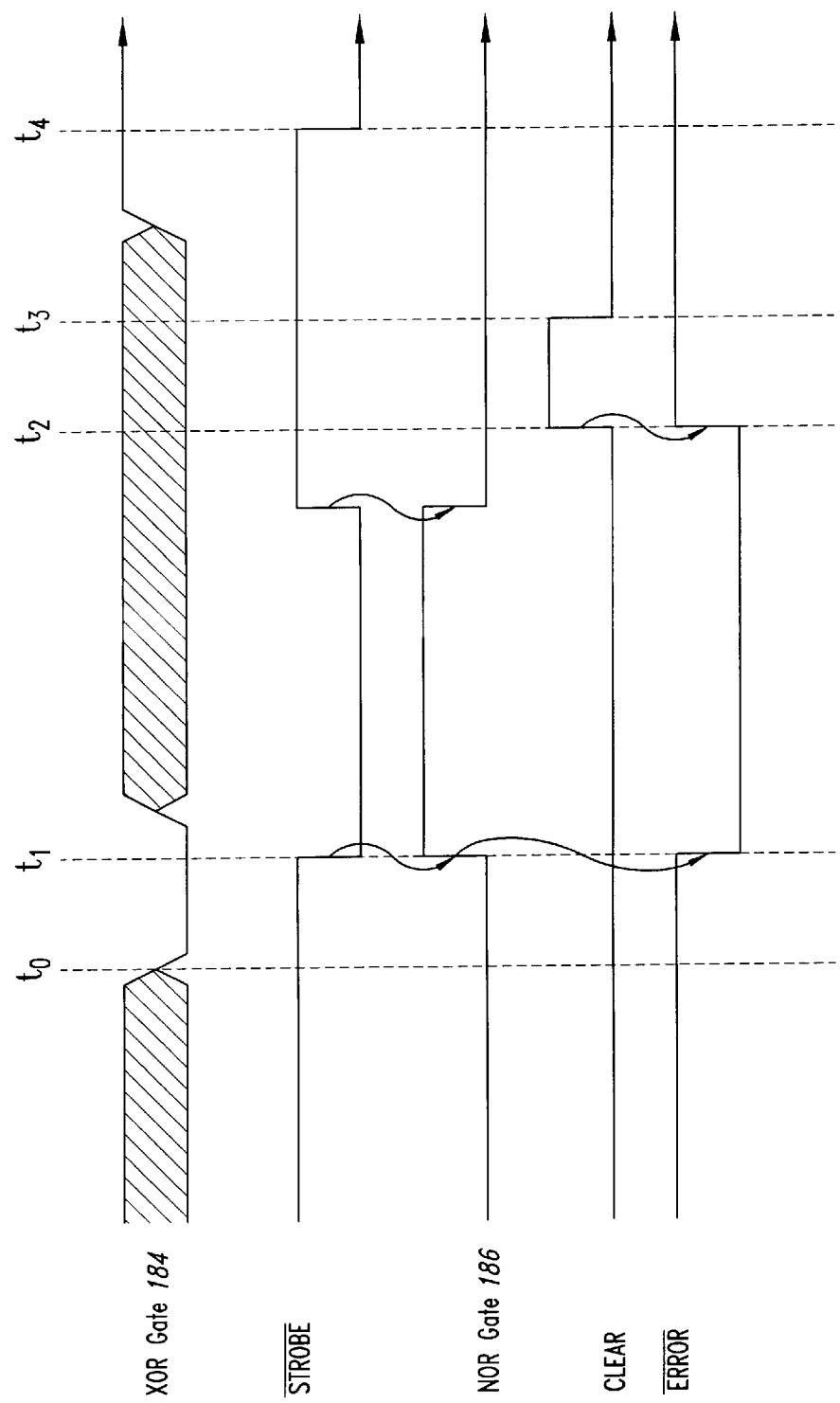
FIG. 2 is a timing diagram illustrating various signals during operation of the error detection circuit of FIG. 1.

The operation of the error detection circuit 34 will now be explained in more detail with reference to the timing diagram of FIG. 2. Before a time $t_0$, the test control circuit 22 drives the signals $\overline{\text{STROBE}}$ and CLEAR inactive, and the error detection circuit 34 drives the error signal $\overline{\text{ERROR}}$ inactive. The inactive strobe signal $\overline{\text{STROBE}}$ disables the NOR gate 186 so that the state of the output of the XOR gate 184 does not affect the state of the error signal $\overline{\text{ERROR}}$. Assume at the time $t_0$, the data on the terminals DOUT and TDOUT are unequal causing the XOR gate 184 to drive its output low. At a time $t_1$, the test control circuit 22 drives the strobe signal $\overline{\text{STROBE}}$ low causing the NOR gate 186, which now has two low inputs, to drive its output high. In response to the high output of the NOR gate 186, the RS flip-flop circuit 188 drives the error signal $\overline{\text{ERROR}}$ low indicating that the data on the terminals DOUT and TDOUT are unequal. At just before a time $t_2$, the test control circuit 22 drives the strobe signal $\overline{\text{STROBE}}$ high causing the NOR gate 186 to drive its output low. The low output of the NOR gate 186 corresponds to the set input of the flip-flop 188 going inactive which does not change the state of the error signal $\overline{\text{ERROR}}$ as understood by one skilled in the art. At the time $t_2$, the test control circuit 22 drives the signal CLEAR high, thereby resetting the RS flip-flop circuit 188, which, in turn, drives the error signal $\overline{\text{ERROR}}$ inactive HIGH. The test control circuit 22 drives the clear signal CLEAR low at a time $t_3$ in anticipation of comparing new data placed on the terminals DOUT and TDOUT.

At just before a time $t_4$, new data on the terminals DOUT and TDOUT is applied to the inputs of the XOR gate 184. This time the data is equal causing the XOR gate 184 to drive its output high as shown at just before the time $t_4$. When the output of the XOR gate 184 is high, the NOR gate 186 is disabled driving its output low independent of the strobe signal $\overline{\text{STROBE}}$. Thus, when the test control circuit 22 activates the strobe signal $\overline{\text{STROBE}}$ at the time $t_4$, the RS flip-flop circuit 188 continues driving the error signal $\overline{\text{ERROR}}$ inactive HIGH because the NOR gate 186 continues driving the set input of the RS flip-flop circuit 188 inactive low.

Referring back to FIG. 1, the test circuit 11 further includes a clock frequency multiplier circuit 40 receiving an external clock signal CLK through a transfer gate 41. In response to the external clock signal CLK, the multiplier circuit 40 develops a test clock signal TSTCLK having a frequency greater than the frequency of the external clock signal CLK. The test clock signal TSTCLK is output by the clock frequency multiplier circuit 40 through a transfer gate 43 to an internal clock node 45 coupled to the test control circuit 22, which develops the previously described address and control signals in response to the test clock signal TSTCLK, as will be discussed in more detail below. The external clock signal CLK is also transferred directly through a transfer gate 47 to the clock node 45. The test control circuit 22 provides a control signal TMCONT0 to the transfer gate 47, and the control signal TMCONT0 is provided through an inverter 49 to the transfer gates 41 and 43. When the control signal TMCONT0 is inactive low, the transfer gates 41 and 43 turn OFF and transfer gate 47 turns ON providing the external clock signal CLK on the clock node 45.

If the control signal TMCONT0 is active high, the transfer gate 47 turns OFF and the transfer gates 41 and 43 turn ON providing the signal TSTCLK on the clock node 45.

In operation, the test circuit 11 operates in two modes, a test mode and a pass-through mode, controlled by the state of a test mode signal TM received by the test control circuit 22. In the pass-through mode, an external circuit (not shown in FIG. 1) drives the test mode signal TM inactive causing the test control circuit 22 to deactivate all address and control signals it develops. When the control circuit 22 drives the control signal TMCONT0 inactive low, the transfer gates 41 and 43 turn OFF isolating the multiplier circuit 40, and the transfer gate 47 turns ON placing the external clock signal CLK on the clock node 45. The test control circuit 22 also drives the signals TMCONT1 and TMCONT2 inactive low turning ON the transfer gates 16 and 18, and turning OFF the transfer gates 26, 28, and 36. When the transfer gate 16 turns ON, a conventional data write path is established from the data terminal DQ through the data input buffer 14 and through the transfer gate 16 to the data input terminal DIN of the array 12. In the same way, when the transfer gate 18 turns ON, a conventional data read path is established from the data output terminal DOUT through the transfer gate 18 and then through the data output buffer 20 to the data terminal DQ. The inactive transfer gates 26 and 28 isolate the storage circuit 24 from the conventional data write path, and the inactive transfer gate 36 isolates the error detection circuit 34 from the conventional data read path. During the pass-through mode of operation, other circuitry (not shown in FIG. 1) in the memory device including the test circuit 11 operates in response to the clock signal CLK on the node 45 to read data from and write data to memory cells in the array 12.

When the external circuit activates the test mode signal TM, the test circuit 11 operates in the test mode to test memory cells in the array 12. In the test mode, the test control circuit 22 first activates the control signal TMCONT0 turning OFF the transfer gate 47 and turning ON the transfer gates 41 and 43 so that the frequency multiplier circuit 40 provides the clock signal TSTCLK on the node 45 to drive the test control circuit 22 and other circuitry in the memory device containing the test circuit 11. During the test mode, the test control circuit 22 controls the components in the test circuit 11 to operate in one of three submodes, a test data write submode, a test data read submode, and a test data compare submode, as will be explained in more detail. The test control circuit 22 commences operation in the test data write submode by activating the control signal TMCONT1. In response to the active control signal TMCONT1, the transfer gate 16 turns OFF breaking the conventional data write path, and the transfer gate 26 turns ON establishing a test data write path from the data terminal DQ through the data input buffer 14 to the input terminal TDIN of the storage circuit 24. The active control signal TMCONT1 also turns ON the transfer gate 28 establishing a test data read path from the terminal TDOUT of the storage circuit 24 to the input terminal DIN of the array 12 as will be discussed in more detail below.

After activating the control signal TMCONT1, the test control circuit 22 activates the write test data signal WRTTD. The test control circuit 22 then sequentially develops the address signals A0–A2 in response to the clock signal TSTCLK, and the address decoder 32, in turn, sequentially activates the decoded address signals ADDR1–ADDR8. When each of the decoded address signals ADDR1–ADDR8 is activated, the external circuit applies a bit of test data on the data terminal DQ. The bit of test data is transferred through the data input buffer 14 and transfer gate 26 to the terminal TDIN, and from the terminal TDIN to the one of the latches 102–116 corresponding to the activated one of the decoded address signals ADDR1–ADDR8. For example, when the decoded address signal ADDR1 is activated, the data placed on the data terminal DQ by the external circuit is transferred to the input terminal TDIN and then through the activated transfer gate 118 to the latch 102. This process continues until a bit of test data has been stored in each of the latches 102–116. It should be noted that the rate data may be transferred into the latches 102–116 is limited by the maximum data transfer rate of the external circuit, which is typically a slower rate determined by the external clock signal CLK.

Once test data has been stored in the latches 102–116, the test control circuit 22 deactivates the write test data signal WRTTD terminating the test data storage submode of operation. The test control circuit 22 thereafter activates the read test data signal RDTD, beginning operation in the test data read submode. In the test data read submode, the test control circuit 22 once again sequentially applies address signals A0–A2 to the address decoder 32 which, in turn, sequentially activates the decoded address signals ADDR1–ADDR8. In response to the sequentially activated signals ADDR1–ADDR8, the storage circuit 24 sequentially places on the terminal TDOUT the data stored in the latches 102–116. As the data in the latches 102–116 is sequentially placed on the terminal TDOUT, the test control circuit 22 accesses corresponding memory cells in the array 12 to thereby transfer each bit of data placed on the terminal TDOUT over the terminal DIN and into the accessed memory cell in the array 12. For example, a row of memory cells in the array 12 may be activated and the test data placed on the terminal TDOUT sequentially transferred into memory cells in eight consecutive columns in the activated row. During the test data read submode, the test data in the latches 102–116 is transferred to memory cells in the array 12 at a rate determined by the high frequency clock signal TSTCLK reducing the time to transfer test data to all the memory cells in the array 12. One skilled in the art will realize the test control circuit 22 may access the test data in the storage circuit 24 in different ways and thereby vary the values of test data written to particular memory cells in the array 12.

After the control circuit 22 has transferred test data into all memory cells in the array 12, the test circuit 11 begins operation in the test data compare submode. In the test data compare submode, the test control circuit 22 maintains the read test data signal RDTD active, and also activates the control signal TMCONT2. In response to the active control signal TMCONT2, the transfer gate 18 turns OFF, breaking the conventional data read path, and the transfer gate 36 turns ON so the error signal $\overline{ERROR}$ output by the error detection circuit 34 is transferred through the transfer gate 36 and through the data output buffer 20 to the data terminal DQ. At this point, the test control circuit 22 typically deactivates the control signal TMCONT1 turning OFF the transfer gates 26 and 28 and turning ON the transfer gate 16 to isolate the terminal TDOUT from the terminal DIN. This is done because the terminals DOUT and DIN, as previously discussed, typically include common components that could result in data contention between data on the terminal TDOUT and data on the terminal DOUT. The test control circuit 22 thereafter develops the address signals A0–A2 and controls the array 12 in the same sequence as during the test data read submode. In this situation, however, the data on the terminal TDOUT is not transferred to the accessed memory cell in the array 12. Instead, the test data on the terminal TDOUT is applied to one input of the error detection circuit 34, and the data stored in the accessed memory cell is applied via the terminal DOUT to the other input of the error detection circuit 34. The error detection circuit 34 operates as previously described to compare the test data placed on the terminal TDOUT to the data placed on the terminal DOUT by the accessed memory cell to determine whether the data is equal. At this point, the test control circuit 22 activates the strobe signal $\overline{STROBE}$ causing the error detection circuit 34 to drive the error signal $\overline{ERROR}$ active low when the compared data is unequal, and to drive the error signal $\overline{ERROR}$ inactive when the compared data is equal. Thus, when the error signal $\overline{ERROR}$ is inactive, the accessed memory cell is operating properly since the data stored in the accessed memory cell is the same as the data transferred to that cell from the corresponding one of the latches 102–116 during the test data read submode of operation. In contrast, when the error signal $\overline{ERROR}$ is active, the accessed memory cell is defective because the data stored in the accessed memory cell does not equal the test data transferred to the cell. The error signal $\overline{ERROR}$ is placed on the data terminal DQ where it may be read by the external circuit to detect whether the accessed memory cell is defective. After the external circuit has detected the state of the error signal $\overline{ERROR}$, the control circuit 22 drives the clear signal CLEAR active causing the error detection circuit 34 to drive the error signal $\overline{ERROR}$ inactive in anticipation of comparing new data on the terminals TDOUT and DOUT.

In the test data compare submode, the test control circuit 22 accesses data stored in the memory cells and in the latches 102–116 at a rate determined by the clock signal TSTCLK. As previously explained, this rate is typically much faster than the rate at which the external test circuit operates. Thus, the external test circuit may not be able to detect the state of the error signal $\overline{ERROR}$ after each comparison by the error detection circuit 34. Instead, the external circuit would typically detect the state of the error signal $\overline{ERROR}$ once after a predetermined number of comparisons were made by the circuit 34. The error detection circuit 34 maintains the error signal $\overline{ERROR}$ inactive unless the compared data is unequal, and once the error signal $\overline{ERROR}$ goes active it remains active until the clear signal CLEAR goes active. Thus, the error detection circuit 34 can make a number of comparisons, and if any of such comparisons are unequal the error signal $\overline{ERROR}$ goes active, and otherwise remains inactive. In this way, the external test circuit can determine whether a range of memory cells includes one or more defective memory cells. For example, assume the external test circuit can detect the state of the error signal $\overline{ERROR}$ once for every eight memory cells that are accessed in the array 12. The external test circuit can accordingly determine whether one or more memory cells in a given group of eight memory cells is defective. In this embodiment, the test control circuit 22 activates the clear signal CLEAR after the error detection circuit 34 has compared the data stored in each group of eight memory cells.

In an alternative embodiment, the external test circuit merely detects the state of the error signal $\overline{ERROR}$ once after the error detection circuit 34 has compared the data in all memory cells in the array 12 to the corresponding data in the storage circuit 24. In this embodiment, the external test circuit determines the memory device including the test circuit 11 contains no defective memory cells when the error signal $\overline{\text{ERROR}}$ is inactive. Conversely, when the error signal $\overline{\text{ERROR}}$ is active the external test circuit determines one or more memory cells in the array 12 is defective. The memory device including the test circuit 11 may then be subjected to further testing by the external test circuit or by another piece of test equipment to detect which cells are defective.

The on-chip test circuit 11 enables an external memory tester operating at a rate determined by a lower frequency clock signal CLK to test the memory device 10 much more quickly than in a conventional test system. In a conventional test system, the external memory tester drives the memory device 10 with the clock signal CLK and transfers data to and from the memory device at a slower rate corresponding to the low frequency of the clock signal CLK. With the on-chip test circuit 11, however, once the external test circuit has transferred the test data into the storage circuit 24 during the test data write submode of operation, the test circuit 11 accesses the memory cells in the array 12 at a much faster rate determined by the higher frequency clock signal TSTCLK. The faster rate at which the memory cells in the array 12 are accessed results in a corresponding decrease in the test time of the memory device including the test circuit 11. In addition, the test circuit 11 provides flexibility for the particular test pattern of data used to test the memory cells in the array 12 since the external test circuit may transfer any desired pattern of test data into the storage circuit 24. In contrast, a conventional on-chip memory test circuit utilizes one or more predetermined test data patterns in testing for defective memory cells.

Although the storage circuit 24 is described as including eight latches 102–116, one skilled in the art will realize that any number of latches may be included. For example, in an alternative embodiment the storage circuit 24 includes the same number of latches 102–116 as the number of columns of memory cells in the array 12. As the number of latches 102–116 increases, the number of NAND gates in the storage circuit 24 must increase accordingly, and the address decoder circuit 32 must also provide additional decoded address signals ADDR. For example, if there are 1,024 columns in the array 12, there are 1,024 latches in the storage circuit 24 and the address decoder circuit 32 must develop decoded address signals ADDR1–ADDR1024. In this embodiment, the test control circuit 22 must provide ten address signals A0–A9 enabling the address decoder circuit 32 to decode these signals and activate the corresponding one of the decoded address signals ADDR1–ADDR1024. In addition, although only at single error detection circuit 34 is shown in the embodiment of FIG. 1, additional error detection circuits 34 may be included and have their outputs coupled through respective output buffers 20 to corresponding data terminals DQ of the memory device 10. By using a plurality of error detection circuits 34, data stored in multiple cells in the array 12 can be read out in parallel and compared to corresponding expect data on the terminal TDOUT, further reducing the time for testing the array 12.

Although the storage circuit 24 is described as including latches that are addressed to store the test data, other circuitry may also be utilized in forming the storage circuit 24. For example, the storage circuit 24 may include circuitry to serially clock the test data into and out of the storage circuit 24. Alternatively, the test data may be applied on a number of terminals of the memory device 10 and latched into the storage circuit 24 in parallel, and thereafter transferred out of the storage circuit serially or in parallel. Other configurations of the test circuit 24 are also possible as will be understood by one skilled in the art.

Figure 3:
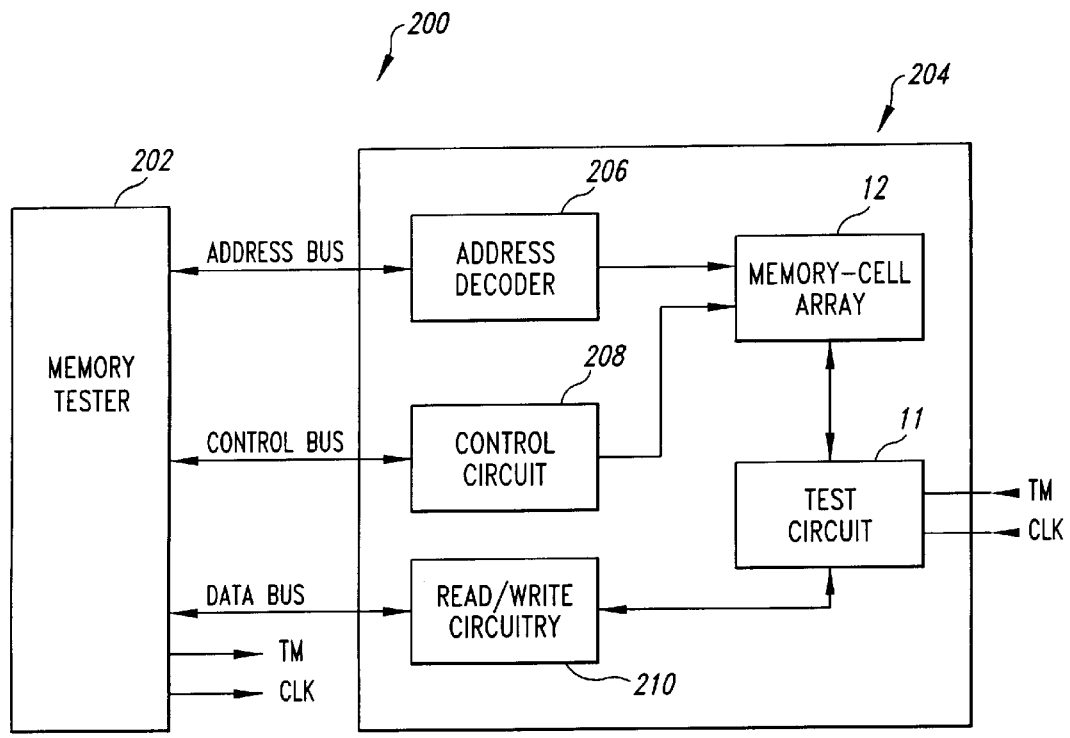
FIG. 3 is a functional block diagram of a test system including an automated memory tester coupled to a memory device including the test circuit of FIG. 1.

FIG. 3 is functional block diagram of a test system 200 including a memory tester 202 coupled to a memory device 204 including the test circuit 11 of FIG. 1. The memory tester 202 is coupled to an address bus, control bus, and data bus of the memory device 204 and develops signals on these buses to control the memory device 204 during testing. The test circuit 202 also provides the clock signal CLK and the test mode TM signal to the memory device 204. The test mode signal TM may correspond to a separate logic level signal, a "supervoltage applied" to one of the pins of the memory device 204, or a combination of control signals on the control bus such as providing a column address strobe signal $\overline{\text{CAS}}$ before a row address strobe signal $\overline{\text{RAS}}$. The memory device 204 includes an address decoder 206 receiving address signals on the address bus and providing decoded address signals to the memory-cell array 12. A control circuit 208 receives control signals on the control bus and controls the operation of other components in the memory device 204 in response to these control signals. A read/write circuit 210 is coupled through the test circuit 11 to the array 12 and operates to transfer information to and from the data bus during read and write operations, respectively. All of the address decoder 206, control circuit 208 and read/write circuitry 210 are conventional and known in the art. Although the memory device 204 is described as an SDRAM, such as a SyncLink DRAM, the memory device 204 may also be an asynchronous DRAM, SRAM, or other type of memory as understood by one skilled in the art.

During normal operation of the memory device 204, an external circuit (not shown in FIG. 3) applies address, control, and data signals on the respective buses, drives the test mode signal TM inactive and supplies the clock signal CLK. During a read cycle, the external circuit applies a memory address on the address bus and control signals on the control bus. In response to the memory address on the address bus, the address decoder 206 outputs a decoded memory address to the array 12, and the control circuit 208 applies control signals to control the memory-cell array 12 such that data corresponding to the decoded memory address output to the read/write circuitry 210. The read/write circuitry 210 then outputs this data on the data bus for use by the external circuit. During a write cycle, the external circuit applies a memory address on the address bus, control signals on the control bus, and data on the data bus. Once again, the address decoder 206 decodes the memory address on the address bus and outputs a decoded address to the array 12. The read/write circuit 210 transfers the data applied on the data bus through the test circuit 11 to the addressed memory cell in the array 12, and this data is stored in the addressed memory cell under control of control signals from the control circuit 208.

In the test mode of operation, the memory tester 202 activates the test mode signal TM and supplies the clock signal CLK. The test circuit 202 then transfers the test data pattern over the data bus and through the read/write circuit 210 to the storage circuit 24 in the test circuit 11. The test circuit 11 then operates as previously described to test the memory cells in the array 12 and outputs the error signal $\overline{\text{ERROR}}$ on one of the lines of the data bus. The test circuit 202 monitors the line of the data bus on which the error signal $\overline{\text{ERROR}}$ is placed to determine whether the memory device 204 has any defective memory cells.

Figure 4:
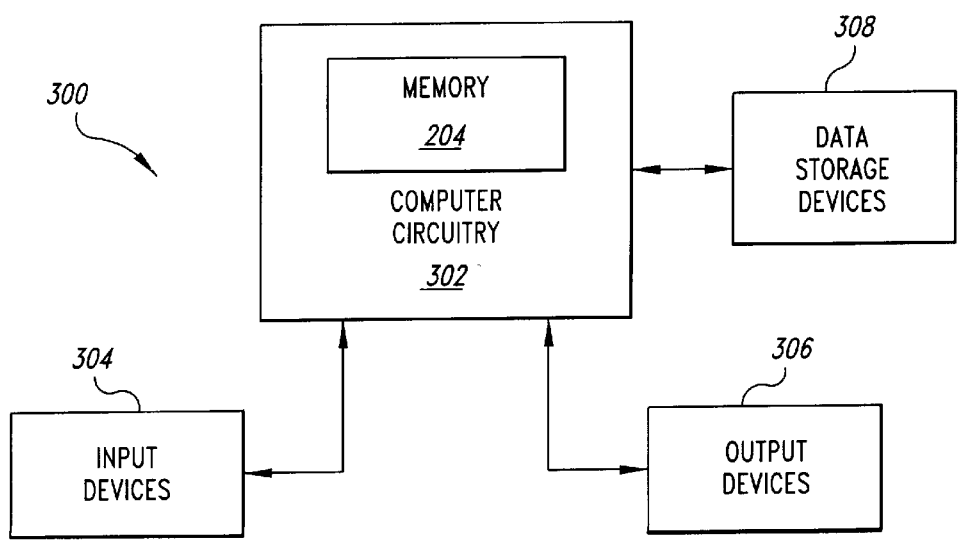
FIG. 4 is a functional block diagram of a computer system including the memory device of FIG. 3.

FIG. 4 is a block diagram of a computer system 300 including the memory device 204 of FIG. 3. The computer system 300 includes computer circuitry 302 for performing various computing functions, such as executing specific software to perform specific calculations or tasks. In addition, the computer system 300 includes one or more input devices 304, such as a keyboard or a mouse, coupled to the computer circuitry 302 to allow an operator to interface with the computer system 300. Typically, the computer system 300 in includes one or more output devices 306 coupled to the computer circuitry 302, such output device is typically being a printer or a video terminal. One or more data storage devices 308 are also typically coupled to the computer circuitry 302 to store data or retrieve data from the external storage media (not shown). Examples of typical data storage devices 308 include hard and floppy disks, tape cassettes, and compact disk read only memories ("CD-ROMs"). The computer circuitry 302 is typically coupled to the memory device 204 through a control bus, a data bus, and an address bus to provide for writing data to and reading data from the memory device 204.

It is to be understood that even though various embodiments and advantages of the present invention have been set forth in the foregoing description, the above disclosure is illustrative only, and changes may be made in detail, and yet remain within the broad principles of the invention. For example, an on-chip test circuit according to the present invention may be included in any high-speed memory device, including SDRAM, SLDRAM, SRAM, and RAMBUS type devices. Therefore, the present invention is to be limited only by the appended claims.

What is claimed is:

1. An on-chip test circuit included in an integrated circuit memory device, the memory device including a memory-cell array having a plurality of memory cells arranged in rows and columns and a data terminal adapted to receive a data signal, the test circuit comprising:

a test mode terminal adapted to receive a test mode signal;

a test data storage circuit including an input coupled to the data terminal and an output coupled to the memory-cell array, and terminals adapted to receive respective read test data and write test data signals, the test data storage circuit storing bits of data applied on the data terminal when the write test data signal is active, and providing on its output the bits of stored data when the read test data signal is active;

an error detection circuit including a first input coupled to the memory-cell array and a second input coupled to the output of the test data storage circuit, the error detection circuit developing an active error signal on an output when the data on its inputs is unequal; and a test control circuit coupled to the terminals of the test data storage circuit, and to the test mode terminal, the test control circuit operable, when the test mode signal is active, in a first mode to activate the write test data signal and transfer data applied on the data terminal into the storage circuit at a first rate, operable in a second mode to activate the read test data signal and transfer data from the storage circuit to the memory cells in the array at a second rate that is greater than the first rate, and operable in a third mode to activate the read test data signal and access data stored in the memory cells at a third rate that is greater than the first rate such that the error detection circuit compares the data stored in each memory cell to the data initially transferred to that memory cell.

2. The test circuit of claim 1 wherein the test data storage circuit comprises:

a plurality of latch circuits each having a respective input and an output, each latch circuit storing a bit of data applied on its input and providing the stored data on an output;

a plurality of input and output switch circuits, each switch circuit including first and second signal terminals and a control terminal adapted to receive a respective address control signal, the first signal terminal of each input switch circuit coupled to the input of an associated latch circuit and the second signal terminals of all input switch circuits coupled together, and the first signal terminal of each output switch circuit coupled to the output of an associated latch circuit and the second signal terminals of all output switch circuits coupled together, and each switch circuit coupling its first signal terminal to the second signal terminal responsive to the address control signal;

an input addressing circuit including a plurality of NAND gates, each NAND gate having an output coupled to the control terminal of an associated input switch circuit, a first input coupled to receive the write test data signal, and a second input coupled to receive an address signal; and an output addressing circuit including a plurality of NAND gates, each NAND gate having an output coupled to the control terminal of an associated output switch circuit, a first input coupled to receive the read test data signal, and a second input coupled to receive an address signal.

3. The test circuit of claim 1 wherein the error detection circuit comprises:

an XOR gate having an output, one input coupled to the array, and a second input coupled to the output of the test data storage circuit;

a NOR gate having one input coupled to the output of the XOR gate, a second input coupled to the test control circuit, and an output;

an RS flip-flop circuit including two cross-coupled NOR gates, the flip-flop including a set input coupled to the output of the NOR gate, a reset input coupled to the test control circuit, and an output on which the error signal is developed.

4. The test circuit of claim 1 wherein the memory-cell array includes M columns and the test data storage circuit stores M bits of data.

5. The on-chip test circuit of claim 1 wherein the second rate is substantially equal to the third rate.

6. The on-chip test circuit of claim 5 wherein the first rate is determined by an external clock signal and the second and third rates are determined by an internal clock signal that is derived from the external clock signal, the internal clock signal having a frequency that is greater than a frequency of the external clock signal.

7. An on-chip test circuit in an integrated circuit memory device, the memory device including a data terminal adapted to receive a data signal, and an array having a plurality of memory cells arranged in rows and columns, each memory cell storing a bit of data and having an associated address, comprising:

a test mode terminal adapted to receive a test mode signal;

an external clock terminal adapted to receive an external clock signal having a frequency;

a clock multiplier circuit having an input coupled to the external clock terminal, the multiplier circuit developing an internal clock signal on an output in response to the external clock signal, the internal clock signal having a frequency greater than the frequency of the external clock signal;

a test data storage circuit including an input, output, and terminals adapted to receive respective control signals, the test data storage circuit operable in a first mode responsive to the control signals to store bits of data applied on the input, and operable in a second mode responsive to the control signals to provide on its output the stored bits of data;

an error detection circuit having inputs coupled respectively to the array and the output of the test data storage circuit, the error detection circuit activating an error signal on an output when the compared data is unequal;

a switch circuit including a first terminal coupled to the data terminal, a second terminal coupled to the input of the test data storage circuit, a third terminal coupled to the array, and a fourth terminal coupled to the output of the error detection circuit, the switch circuit selectively coupling the first terminal to one of the second, third, and fourth terminals responsive to a control signal; and a test control circuit coupled to the output of the clock multiplier circuit, the test mode terminal, the array, and the control terminal of the switch circuit, the test control circuit operable responsive to the internal clock signal when the test mode signal is inactive to couple the data terminal to the array, and operable when the test mode signal is active to develop control signals to couple the data terminal to the input of the test data storage circuit, transfer data applied on the data terminal into the test data storage circuit at a first rate determined by the external clock signal, transfer data stored in the test data storage circuit into memory cells in the array at a second rate determined by the internal clock signal, access the data in respective memory cells in the array and the data in the storage circuit that was initially transferred to the memory cell such that the error detection circuit compares these two bits of data at a third rate determined by the internal clock signal, and couple the output of the error detection circuit to the data terminal so that the error signal is developed on the data terminal.

8. The test circuit of claim 7 wherein the test data storage circuit comprises:

a plurality of latch circuits each having a respective input and an output, each latch circuit storing a bit of data applied on its input and providing the stored data on an output;

a plurality of input and output switch circuits, each switch circuit including first and second signal terminals and a control terminal adapted to receive a respective address control signal, the first signal terminal of each input switch circuit coupled to the input of an associated latch circuit and the second signal terminals of all input switch circuits coupled together, and the first signal terminal of each output switch circuit coupled to the output of an associated latch circuit and the second signal terminals of all output switch circuits coupled together, and each switch circuit coupling its first signal terminal to the second signal terminal responsive to the address control signal;

an input addressing circuit including a plurality of NAND gates, each NAND gate having an output coupled to the control terminal of an associated input switch circuit, a first input coupled to receive the write test data signal, and a second input coupled to receive an address signal; and an output addressing circuit including a plurality of NAND gates, each NAND gate having an output coupled to the control terminal of an associated output switch circuit, a first input coupled to receive the read test data signal, and a second input coupled to receive an address signal.

9. The test circuit of claim 7 wherein the error detection circuit comprises:

an XOR gate having an output, one input coupled to the array, and a second input coupled to the output of the test data storage circuit;

a NOR gate having one input coupled to the output of the XOR gate, a second input coupled to the test control circuit, and an output; and an RS flip-flop circuit including two cross-coupled NOR gates, the flip-flop including a set input coupled to the output of the NOR gate, a reset input coupled to the test control circuit, and an output on which the error signal is developed.

10. The test circuit of claim 7 wherein the memory-cell array includes M columns and the test data storage circuit stores M bits of data.

11. A memory device, comprising:

an address bus;

a control bus;

a data bus;

a terminal adapted to receive a test mode signal;

an address decoder coupled to the address bus;

a control circuit coupled to the control bus;

a read/write circuit coupled to the data bus;

a memory-cell array coupled to the address decoder and read/write circuit, the array having a plurality of memory cells arranged in rows and columns, each memory cell storing a bit of data; and a test circuit coupled to the data bus, including, a test data storage circuit including an input coupled to the data bus and an output coupled to the memory-cell array, and terminals adapted to receive respective read test data and write test data signals, the test data storage circuit storing bits of data applied on the data bus when the write test data signal is active, and providing on its output the bits of stored data when the read test data signal is active, an error detection circuit including a first input coupled to the memory-cell array and a second input coupled to the output of the test data storage circuit, the error detection circuit developing an active error signal on an output when the data on its inputs is unequal, and a test control circuit coupled to the terminals of the test data storage circuit, and to the test mode terminal, the test control circuit operable, when the test mode signal is active, in a first mode to activate the write test data signal and transfer data applied on the data bus into the storage circuit at a first rate, operable in a second mode to activate the read test data signal and transfer data from the storage circuit to the memory cells in the array at a second rate that is greater than the first rate, and operable in a third mode to activate the read test data signal and access data stored in the memory cells at a third rate that is greater than the first rate such that the error detection circuit compares the data stored in each memory cell to the data initially transferred to that memory cell.

12. The memory device of claim 11 wherein each memory cell comprises:

an access transistor having a gate terminal coupled to a respective word line associated with each row of memory cells in the array, and a drain terminal coupled to one of a respective pair of complementary digit lines associated with each column of memory cells, and a source terminal; and a capacitor having a first plate coupled to the source terminal, and a second plate coupled to receive a reference voltage.

13. The memory device of claim 11 wherein the second rate is substantially equal to the third rate.

14. The memory device of claim 13 wherein the first rate is determined by an external clock signal and the second and third rates are determined by an internal clock signal that is derived from the external clock signal, the internal clock signal having a frequency that is greater than a frequency of the external clock signal.

15. A test system for detecting defects in a memory device, comprising:

a memory device including,
    address, data and control buses to which an address decoder, read/write circuit, and control circuit are coupled, respectively,
    a terminal adapted to receive a test mode signal,
    a memory-cell array coupled to the address decoder and read/write circuit, the array having a plurality of memory cells arranged in rows and columns, each memory cell storing a bit of data, and
    a test circuit coupled to the data bus, including,
        a test data storage circuit including an input coupled to the data bus and an output coupled to the memory-cell array, and terminals adapted to receive respective read test data and write test data signals, the test data storage circuit storing bits of data applied on the data bus when the write test data signal is active, and providing on its output the bits of stored data when the read test data signal is active,
        an error detection circuit including a first input coupled to the memory-cell array and a second input coupled to the output of the test data storage circuit, the error detection circuit developing an active error signal on an output when the data on its inputs is unequal, and
        a test control circuit coupled to the terminals of the test data storage circuit, and to the test mode terminal, the test control circuit operable, when the test mode signal is active, in a first mode to activate the write test data signal and transfer data applied on the data bus into the storage circuit at a first rate, operable in a second mode to activate the read test data signal and transfer data from the storage circuit to the memory cells in the array at a second rate that is greater than the first rate, and operable in a third mode to activate the read test data signal and access data stored in the memory cells at a third rate that is greater than the first rate such that the error detection circuit compares the data stored in each memory cell to the data initially transferred to that memory cell; and
    a test device coupled to the address, data, and control buses of the memory device and to the test mode terminal, the test device activating the test mode signal to place the memory device into a test mode and thereafter transferring a predetermined test pattern of data over the data bus to the test circuit at the first rate, and detecting a defect in the memory device when the error signal goes active.

16. The test system of claim 15 wherein the test device sequentially applies separate predetermined test patterns of data which are sequentially stored in the test data storage circuit, the test device determining at least once whether the error signal is active after applying a respective test pattern and before applying a subsequent test pattern.

17. The test system of claim 15 wherein the test device applies an alternating bit pattern of test data which is stored in test data storage register.

18. The test system of claim 15 wherein the second rate is substantially equal to the third rate.

19. The test system of claim 18 wherein the test device applies an external clock signal that determines the first rate, and the second and third rates are determined by an internal clock signal that is derived from the external clock signal, the internal clock signal having a frequency that is greater than a frequency of the external clock signal.

20. A computer system, comprising:

a data input device;

a data output device; and computing circuitry coupled to the data input and output devices, the computing circuitry including a memory device having a data terminal adapted to receive a data signal, and a test circuit including a memory-cell array having a plurality of memory cells arranged in rows and columns, each memory cell storing a bit of data, the test circuit including,
    a test mode terminal adapted to receive a test mode signal,
    a test data storage circuit including an input coupled to the data terminal and an output coupled to the memory-cell array, and terminals adapted to receive respective read test data and write test data signals, the test data storage circuit storing bits of data applied on the data terminal when the write test data signal is active, and providing on its output the bits of stored data when the read test data signal is active,
    an error detection circuit including a first input coupled to the memory-cell array and a second input coupled to the output of the test data storage circuit, the error detection circuit developing an active error signal on an output when the data on its inputs is unequal, and
    a test control circuit coupled to the terminals of the test data storage circuit, and to the test mode terminal, the test control circuit operable, when the test mode signal is active, in a first mode to activate the write test data signal and transfer data applied on the data terminal into the storage circuit at a first rate, operable in a second mode to activate the read test data signal and transfer data from the storage circuit to the memory cells in the array at a second rate that is greater than the first rate, and operable in a third mode to activate the read test data signal and access data stored in the memory cells at a third rate that is greater than the first rate such that the error detection circuit compares the data stored in each memory cell to the data initially transferred to that memory cell.

21. A method for detecting defective memory cells in an array including a plurality of memory cells in an integrated circuit memory device, the memory device including data terminals adapted to receive data, the method comprising the steps of:

placing the memory device in a test mode;

storing in a test data storage circuit contained in the memory device at a first rate a plurality of bits of test data applied on the data terminals;

transferring the stored test data from the test data storage circuit to the memory cells at a second rate that is greater than the first rate;

comparing the test data stored in each of the memory cells to the corresponding test data initially transferred to the memory cell, the comparing being performed at a third rate that is greater than the first rate; and detecting an error in a memory cell when the step of comparing indicates the data stored in the memory cell does not equal the test data transferred to the memory cell.

22. The method of claim 21 wherein the step of storing in the memory device a plurality of bits of test data applied on the data terminals includes the step of storing M bits of data where M equals the number of columns of memory cells in the memory-cell array.

23. The method of claim 21 wherein the step of storing in the memory device a plurality of bits of test data applied on the data terminals includes the step of sequentially storing bits of test data.

24. The method of claim 21 wherein the step of transferring the stored test data to the memory cells includes the step of sequentially transferring single bits of test data to respective memory cells.

25. The method of claim 21 wherein the step of storing in the memory device a plurality of bits of test data occurs at a first rate, and the steps of transferring the stored test data, storing the transferred test data, and comparing the test data all occur at a second rate greater than the first rate.

26. The method of claim 21 wherein the step of detecting occurs once every N times the step of comparing occurs.

27. The method of claim 21 wherein the first rate is determined by a first clock signal and the second and third rates are determined by a second clock signal that is derived from the first clock signal.

28. A method for testing a memory device including a memory-cell array having a plurality of memory cells, the memory device including a data terminal adapted to receive data, a clock terminal adapted to receive an external clock signal having a frequency, an internal clock node on which is developed an internal clock signal having a frequency greater than the external clock signal, the memory device further including a test data storage circuit coupled to the internal clock node which stores a plurality of bits of data, the method comprising the steps of:

applying test data sequentially on the data terminal;

storing the test data applied on the data terminal in the test data storage circuit at a rate determined by the external clock signal;

transferring test data in a predetermined sequence from the test data storage circuit to respective addressed memory cells at a rate determined by the internal clock signal;

accessing a memory cell;

accessing the data in the storage circuit that was transferred to the accessed memory cell;

comparing the test data stored in the accessed memory cell to the corresponding accessed data in the test data storage circuit at the rate determined by the internal clock signal;

detecting an error in a memory cell when the step of comparing indicates the data stored in the accessed memory cell does not equal the corresponding test data in the storage circuit;

activating an error signal on the data terminal when an error is detected; and repeating the steps of accessing a memory cell through activating an error signal for each memory cell in the memory-cell array.

29. The method of claim 28 wherein the step of detecting occurs once every N times the step of comparing occurs.

* * * * *